United States Patent [19]
Ueta et al.

[11] Patent Number: 5,995,527
[45] Date of Patent: Nov. 30, 1999

[54] SEMICONDUCTOR LASER DEVICE HAVING AN INN CONTACT LAYER AND A METHOD OF FABRICATING THE SAME

[75] Inventors: Yoshihiro Ueta, Tenri; Kazuhiko Inoguchi, Nara; Takayuki Yuasa, Nara-ken, all of Japan

[73] Assignee: Sharp Kabushiki Kaisha, Osaka, Japan

[21] Appl. No.: 08/803,303

[22] Filed: Feb. 20, 1997

[30] Foreign Application Priority Data

Feb. 22, 1996 [JP] Japan ..................................... 8-034686
Mar. 26, 1996 [JP] Japan ..................................... 8-070027

[51] Int. Cl.⁶ ................................................. H01S 3/19
[52] U.S. Cl. .............................................. 372/45; 372/43
[58] Field of Search ........................ 372/43, 45; 257/77, 257/96

[56] References Cited

U.S. PATENT DOCUMENTS

| | | |
|---|---|---|
| 4,185,256 | 1/1980 | Scifres et al. ............................. 372/45 |
| 5,187,547 | 2/1993 | Niina et al. ................................ 257/77 |
| 5,243,204 | 9/1993 | Suzuki et al. ............................. 257/77 |
| 5,313,078 | 5/1994 | Fujii et al. ................................. 257/77 |
| 5,329,141 | 7/1994 | Suzuki et al. ........................... 257/103 |
| 5,432,808 | 7/1995 | Hatano et al. ............................ 372/45 |
| 5,587,335 | 12/1996 | Mori et al. ............................... 437/129 |
| 5,625,202 | 4/1997 | Chai ......................................... 257/94 |
| 5,661,074 | 8/1997 | Tischler ................................... 438/32 |
| 5,670,798 | 9/1997 | Schetzina ................................. 257/96 |
| 5,696,389 | 12/1997 | Ishikawa et al. ......................... 357/99 |
| 5,740,192 | 4/1998 | Hatano et al. ............................ 372/45 |

*Primary Examiner*—Rodney Bovernick
*Assistant Examiner*—Ellen E. Kang
*Attorney, Agent, or Firm*—Morrison & Foerster LLP

[57] ABSTRACT

A semiconductor laser device including $Ga_xAl_yIn_{1-x-y}N$ ($0 \leq x \leq 1$, $0 \leq y \leq 1$)) layers has an InN contact layer, which has a thickness ranging, preferably, from 0.1 μm to 1.0 μm inclusive. The contact layer is formed by a MOCVD method. When materials for formation of the InN contact layer are fed into a reactor, an organic radical material is also fed and a substrate temperature is controlled to be about 800° C. during the process of growth of the InN layer.

5 Claims, 3 Drawing Sheets

SEMICONDUCTOR LASER DEVICE HAVING AN INN CONTACT LAYER AND A METHOD OF FABRICATING THE SAME

BACKGROUND OF THE INVENTION

The present invention relates to semiconductor laser devices using an InGaAlN compound semiconductor and a method of fabricating such a semiconductor laser device, and more particularly to a contact layer for such a semiconductor laser device.

InGaAlN compound semiconductors are wide gap semiconductors and have a direct transition type band structure. Therefore InGaAlN compound semiconductors are expected to be applied to light-emitting devices having a radiative wavelength range of from yellow to ultraviolet. In such field of application, light-emitting diodes of double heterostructure have already been put into practical use and, in addition, semiconductor laser devices are being positively developed. The following describes a typical process for fabricating a conventional semiconductor laser device which is shown in FIG. 2. First, an AlN buffer layer 220 of about 0.1 $\mu$m is grown on a 6H—SiC substrate 210 at a substrate temperature of about 1050° C. by an metal organic chemical vapor deposition (hereinafter referred to as MOCVD) method. Subsequently an n type GaN layer 230 of 0.5 $\mu$m and an n type AlGaN cladding layer 241 of 1.0 $\mu$m are grown at the substrate temperature of about 1050° C. Thereafter, the temperature of the substrate is lowered to about 800° C. so that an InGaN active layer of 0.01 $\mu$m is grown. Then, the temperature of the substrate is again raised to about 1050° C. so that a Mg doped AlGaN cladding layer 242 of 1.0 $\mu$m and a Mg doped GaN contact layer 260 of about 0.5 $\mu$m are grown.

After growth of the foregoing layers, the thus formed wafer is removed from the MOCVD apparatus. Then, the wafer is thermally treated at a temperature of about 600° C. in a nitrogen atmosphere for about 30 minutes so that the Mg doped AlGaN cladding layer 242 and Mg doped GaN contact layer 260 are given low resistance p type characteristics. Further, in order to provide an optical waveguide, a dielectric film 270 having an opening of about 1 $\mu$m in width is formed on the GaN contact layer 260, and then a p-side electrode 281 is formed over the entire surface of the dielectric film 270 having the opening, and an n-side electrode 282 is formed on the back of the n-type 6H—SiC substrate 210 by using a conventional vacuum evaporation technique. Further, a facet reflector mirror is formed by dry etching according to the reactive ion beam etching (RIBE) technique, and then the wafer is divided into separate elements by a dicing process. In this way, the semiconductor laser device shown in FIG. 2 is completed.

In the above described conventional semiconductor laser device, the electrode 281 is formed on the GaN layer. Forming an electrode on a GaN layer in such a way is disclosed in, for example, Japanese Patent Application Laid-Open No 6-268259. However, the GaN layer has conventionally been unable to provide a high-concentration distribution of p-type carriers and thus it involves a high element resistance. That is, a high drive voltage is involved and this may adversely affect the device reliability.

SUMMARY OF THE INVENTION

It is a primary object of this invention to provide a semiconductor laser device which allows high concentration distribution of p-type carriers in a layer on which an electrode is to be formed, thereby enabling the element resistance to be reduced so that the drive voltage is reduced, and which can therefore offer an improved element reliability.

In order to accomplish the above object, the present invention provides a semiconductor laser device wherein a semiconductor multiple layer film including $Ga_xAl_yIn_{1-x-y}$-N ($0 \leq x \leq 1, 0 \leq y \leq 1$) layers is formed on a semiconductor substrate, and wherein an InN contact layer is provided as a layer on which an electrode is formed.

FIG. 3 shows a relationship between the band gap and the maximum calculated value of p type carrier concentration in nitrogen-containing compound semiconductors. Also, FIG. 4 shows a relationship between the band gap and the maximum calculated value of p type contact resistance in nitrogen-containing compound semiconductors. As indicated in FIG. 3, an InN layer can have a p type carrier concentration much higher than that of a GaN layer. Therefore, according to the present invention, the contact layer of the semiconductor laser device contains p type carriers at a high concentration, so that the device resistance, and hence, the drive voltage can be reduced, as indicated in FIG. 4.

The InN contact layer may have a thickness ranging between 0.1 $\mu$m and 1 $\mu$m inclusive, for the following reasons.

If the InN contact layer of the semiconductor laser device has a thickness of more than 1 $\mu$m, light absorption loss in the layer will increase, which results in an increased threshold current. On the other hand, if the thickness of the layer is less than 0.1 $\mu$m, during heat treatment after electrode formation, electrode metal will diffuse beyond the contact layer, which results in deterioration of device characteristics. In order to prevent the problems of the light absorption loss and the metal diffusion, it is preferable that the InN contact layer has a thickness ranging from 0.1 $\mu$m to 1 $\mu$m inclusive.

Also, the present invention provides a method of forming the above described InN contact layer for the semiconductor laser device. The method employs a metal organic chemical vapor deposition method with the use of an organometal and $NH_3$ as an indium source (i.e., group III material) and a nitrogen source (i.e., group V material), respectively, for formation of the InN contact layer. This method also comprises feeding an organic material thermally decomposable into a radical into a reactor simultaneously with or prior to feeding of the organometal thereinto, and growing the InN contact layer while controlling a substrate temperature so as to virtually prevent the InN contact layer from being re-evaporated.

During the process of growing an InN thick film, since the vapor pressure of the film itself is high, a substantial portion of the film once formed is reevaporated due to heat. Accordingly, as the film becomes thicker, the structural and electrical crystal characteristics of the film are unfavorably affected more and more. Meanwhile, ammonia ($NH_3$), a V-group material for nitride semiconductor, has a poor thermal decomposition efficiency. Therefore, to grow a high quality InN thick film using $NH_3$ and an organometal, it is required that a sufficient amount of active nitrogen be supplied at a temperature as low as possible, e.g. 800° C., while care is used to prevent re-evaporation. In order to meet these requirements, the present invention utilizes an effective action of organic radicals to enhance the efficiency of material decomposition in proximity of the substrate to thereby grow a good quality InN contact layer.

The substrate temperature of 800° C. cannot perfectly prevent the re-evaporation. The evaporation loss for that temperature, however, is so small that practically no problems will occur.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The present invention is described below in detail in connection with a semiconductor laser device (blue color) having an AlGaN/InGaN double heterostructure on a SiC substrate, which was fabricated as one embodiment of the invention.

Figure 1:
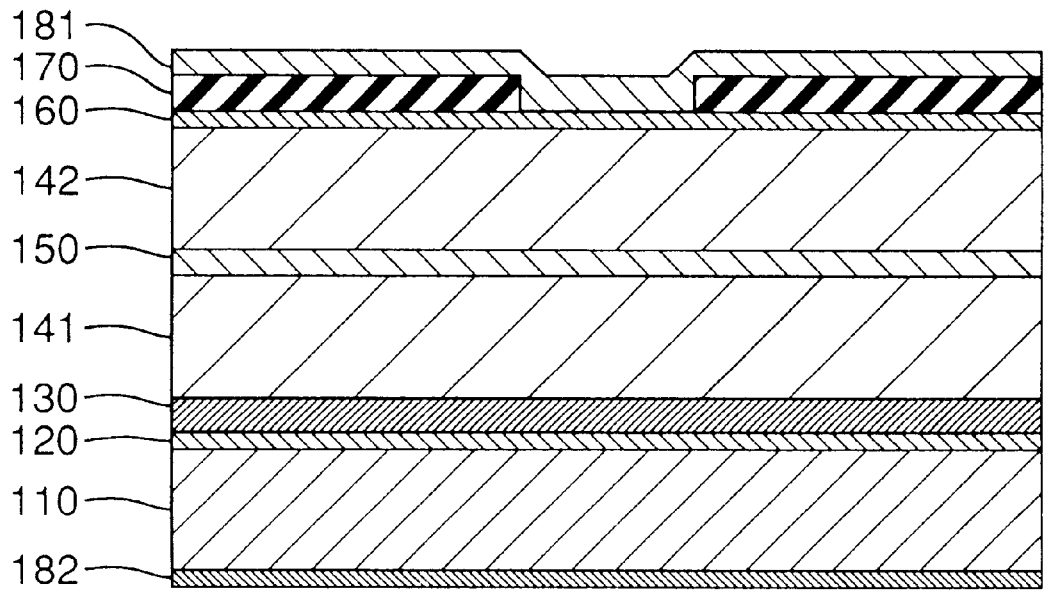
FIG. 1 is a schematic sectional view of a semiconductor laser device having an InN contact layer of not less than 0.1 μm but not more than 1 μm in thickness, fabricated in accordance with an embodiment of the invention.
Figure 2:
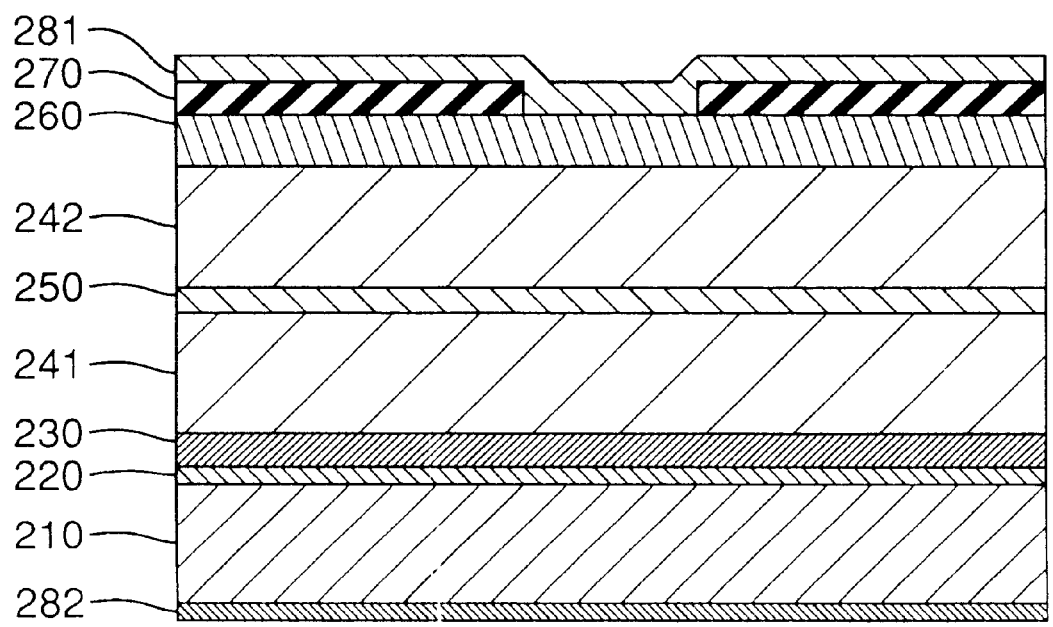
FIG. 2 is a schematic cross sectional view of a prior art semiconductor laser device having a GaN contact layer.
Figure 3:
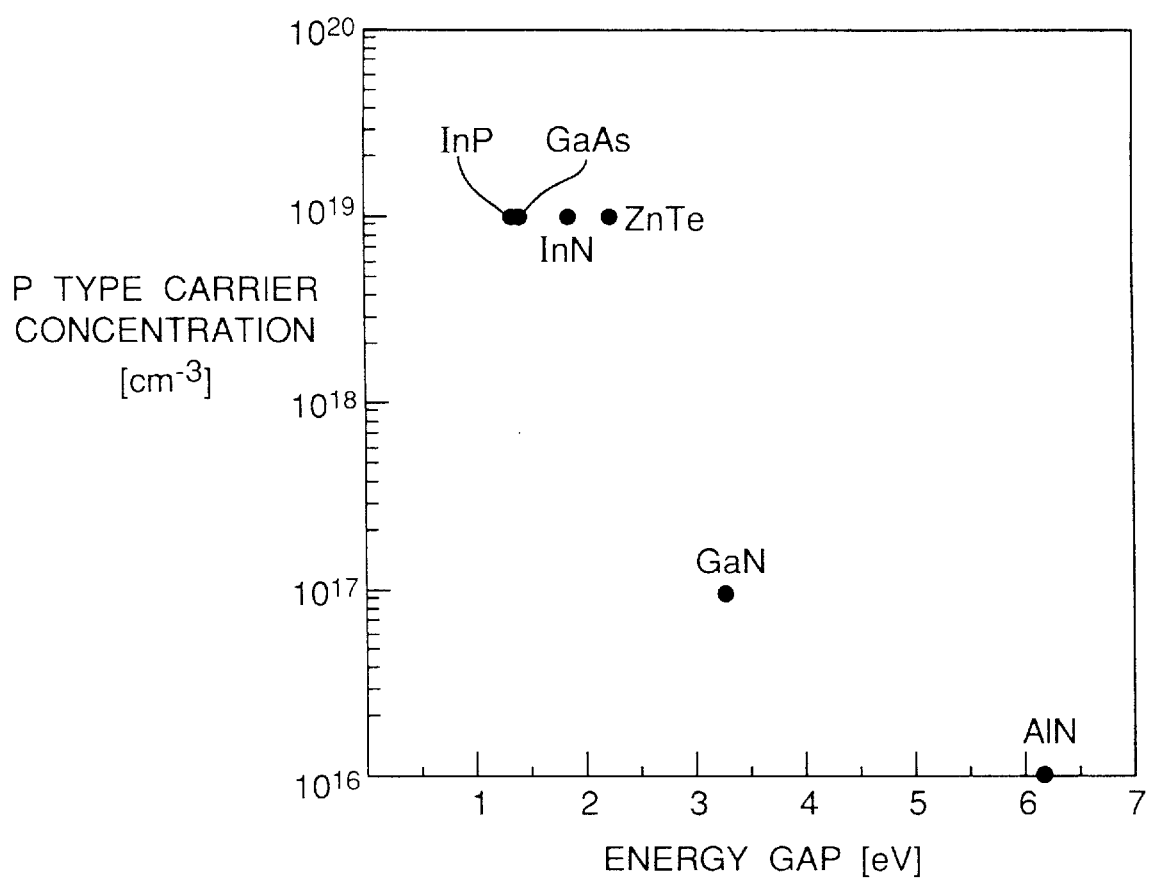
FIG. 3 is a graphic representation showing the relationship between the band gap and the maximum calculated value of p type carrier concentration in different nitrogen-containing compound semiconductor.
Figure 4:
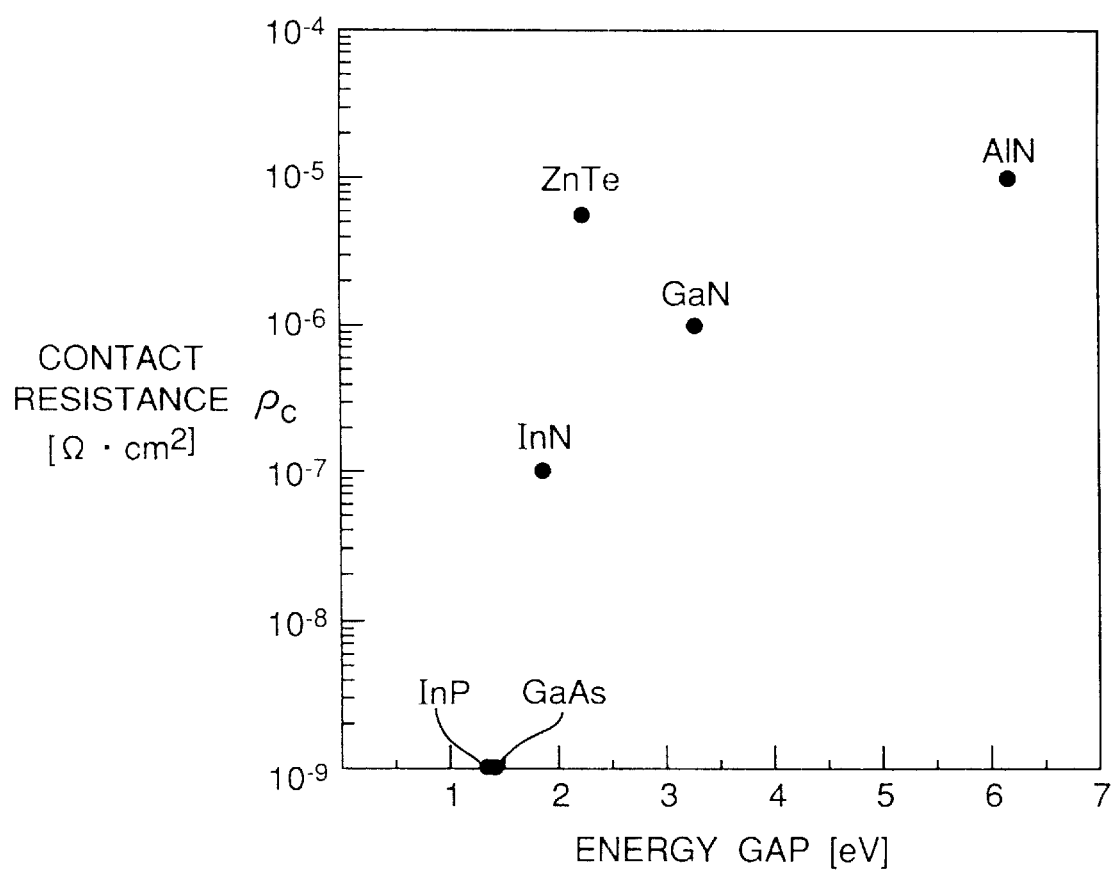
FIG. 4 is a graphic representation showing the relationship between the band gap and the maximum calculated value of p type contact resistance in different nitrogen-containing compound semiconductor.

FIG. 1 shows the construction of the (blue color) semiconductor laser device of the present example. In the FIG. 1 example, the growth of group III-nitride compound semiconductor thin film was carried out by the MOCVD method. The method of fabricating the semiconductor laser device in accordance of the invention will now be described in sequential order.

As a substrate 110, used was an n type 6H—SiC substrate whose main surface is 5 degrees off from a (0001) silicon (Si) plane in a <11–20> direction. That is, the main surface of the 6H—SiC substrate 110 is a plane inclined in the <11–2 0> direction at an angle of 5 degrees with respect to the (0001) silicon (Si) plane. The substrate 110 had already been subjected to oxidation treatment for removal of its damaged surface layer after a surface polishing treatment. The 6H—SiC substrate 110 was set in a reactor of a MOCVD apparatus, and the interior of the reactor was thoroughly replaced with hydrogen. Then, the temperature was raised to and maintained at 1500° C. while hydrogen and NH3 were introduced into the reactor, whereby surface cleaning of the 6H—SiC substrate 110 was carried out.

Then, the substrate temperature was lowered to and stabilized at 1050° C. Thereafter, trimethyl aluminum (TMA) was introduced into the reactor at a flow rate of $3 \times 10^{-5}$ mol per minute, while $NH_3$ was introduced at a flow rate of 5 liters per minute. After a growth time of 5 minutes, an AlN buffer layer 120 of about 0.1 μm was developed.

Then, trimethyl gallium (TMG) was fed at a flow rate of $3 \times 10^{-5}$ mol per minute, $NH_3$ at a flow rate of 5 liters per minute, and silane ($SiH_4$), a doping material, at a flow rate of 0.3 cc. per minute. Thus, after a growth time of 15 minutes, an n type GaN layer 130 of about 0.5 μm was formed.

Subsequently, in addition to $NH_3$ and TMG, TMA was fed into the reactor at the flow rate of $6 \times 10^8$ mol per minute, and $SiH_4$ at the flow rate of 0.3 cc. per minute. After a growth time of 25 minutes, an n type $Al_{0.15}Ga_{0.85}N$ cladding layer 141 of about 1 μm was formed. The electron concentration of this cladding layer was $2 \times 10^{18}$ cm$^{-3}$.

Feeding of TMG, TMA, and $SiH_4$ was stopped and the temperature was lowered to 800° C. After the temperature was stabilized at 800° C., TMG, trimethyl indium (TMI), and azo tertiary butane, an organic radical source, were each introduced into the reactor at the rate of $4 \times 10^{-4}$ mol per minute. After a growth time of 12 seconds, an $In_{0.25}Ga_{0.75}N$ active layer 150 of 10 nm was formed. The peak wavelength of light emission from this layer at room temperature was about 432 nm.

Then, supply of TMG, TMI, and azo tertiary butane was stopped, and temperature was raised to 1050° C. again. After temperature was stabilized at 1050° C., TMA and $CP_2Mg$, a doping material, were each supplied at the flow rate of $5 \times 10^{-6}$ mol per minute. After a growth time of 25 minutes, a p type $Al_{0.15}Ga_{0.85}N$ cladding layer 142 of 1 μm was obtained.

Then, supply of TMG, TMA, and $Cp_2Mg$ was stopped and the temperature was controlled to be stabilized at 800° C. After the temperature was stabilized at 800° C., $NH_3$, TMI, and azo tertiary butane were each introduced simultaneously into the reactor at a respective flow rate of $4 \times 10^{-4}$ mol per minute, while $Cp_2Mg$, a doping material, was introduced thereinto at a flow rate of $5 \times 10^{-5}$ mol per minute. In this way, after a growth time of 10 minutes, a p type InN contact layer 160 of 0.5 μm was formed. In this example, azo tertiary butane was supplied during supply of $NH_3$ and TMI. The growth rate obtained in the MOCVD process, however, is controlled by supply of a group III material, or TMI in this case. Therefore, azo tertiary butane may be first fed, and then TMI may be fed. That is, it is proper to feed azo tertiary butane simultaneously with or prior to feeding of TMI.

After completion of the foregoing steps, the resulting wafer was removed from the reactor of the MOCVD apparatus, and then thermally treated at 700° C. in a nitrogen atmosphere for 20 minutes, whereby the magnesium added $Al_{0.15}Ga_{0.85}N$ layer 142 and InN layer 160 were given low resistance p type characteristics. After this treatment, the $Al_{0.15}Ga_{0.85}N$ layer 142 had a hole concentration of about $1 \times 10^{18}$ cm$^{-3}$, and the InN layer 160 had a hole concentration of about $1 \times 10^{19}$ cm$^{-3}$.

On the upper surface of the wafer having the group III-nitride compound semiconductor thin films laminated as described above was formed a $SiO_2$ thin film 170 by electron beam evaporation, and then a stripe shaped opening of about 1 μm in width was formed by a conventional lithographic technique. Then, an Au/Ni laminated film was vacuum-deposited on the entire top surface of the wafer including the $SiO_2$ film formed with the stripe shaped opening of about 1 μm, whereby a p type electrode 181 was formed.

Subsequently, a $SiO_2$ film (not shown) was formed on the entire upper surface of the wafer by electron beam evaporation, which was in turn shaped into separate $SiO_2$ films (not shown) of about 500 μm in width by using electron beam evaporation technique and photolithographic process, the $Sio_2$ films being spaced from each other by the distance of 50 μm and extending in a direction orthogonal to the electrode stripe 181 formed from the Au/Ni laminated film. Next, for formation of a reflector mirror, reactive ion etching of the wafer was carried out so that the laminated films located below the openings of the $SiO_2$ films were etched down to a level adjacent the AlN buffer layer 120. Further, the back side of the 6H—SiC substrate 110 was polished until the thickness of the 6H—SiC substrate 110 was reduced to about 100 μm, and then Ni was vapor deposited on the entire back surface of the substrate for creating an ohmic electrode 182 thereon.

Finally, the wafer was divided into chips by a scribing or dicing process, and thus the semiconductor laser device shown in FIG. 1 was formed. It is noted that the semiconductor laser device may be incorporated into a package by a conventional method for completion of a laser device.

When electric current was passed through the laser device as formed without coating for reflectivity control being applied to its facet reflector mirror, laser oscillation of 432 nm blue wavelength was observed typically with a 40 mA threshold current, and the pull-up, or threshold voltage in this case was 2.9 V, which is approximately equal to a theoretically anticipated voltage. For a 5 mW output, the drive current was 47 mA (with an efficiency of 0.3 W/A), and the drive voltage was 3.4 V. As a typical radiative angle characteristic was obtained an elipticity of 2 with a vertically divergent angle of 12° was obtained.

For purposes of comparison with the device made in the present example, performance checking was made with respect to a conventional type device having a p type GaN layer as a contact layer (but identical with the device of the present embodiment both in layer structure design other than the contact layer and in carrier concentration setting). With the conventional device, a typical threshold current for laser oscillation was 40 mA, the same value as that observed with the device of the embodiment. However, the threshold voltage in that case was 3.5 V, which value is 0.6 V higher than that observed with the device of the invention. Also, for the 5 mW output, the drive current was typically 47 mA, which value is the same as that observed with the device of the invention, but the drive voltage was 4.1 V, which is 0.7 V higher than that in the case of the device of the invention.

In the instant example, an n type 6H—SiC substrate having a plane 5° offset in the <11–20>direction from the (0001) silicon (Si) plane, was used. Although this particular substrate is most ideal for use in the invention, an n type (0001) silicon (Si) plane 6H—SiC substrate may be used with similar, but somewhat inferior effects.

Materials and combination of layer structures usable in the practice of the invention are not limited to those used in the foregoing example. The present invention is also applicable to a semiconductor laser device having a double heterostructure consisting essentially of a GaN active layer and AlGaN cladding layers, or the like combination, and a semiconductor laser device having a single quantum well (SQW) or a multiple quantum well (MQW) as an active layer, which each are comprised of a group III-nitride semiconductors. In these semiconductor laser devices as well, similar effects are obtained.

As is obvious from the above, because the semiconductor laser device of the present invention has an InN contact layer as a contact layer on which an electrode is formed, the carrier concentration of the contact layer is made higher than that of the conventionally used GaN contact layer. Therefore, it is possible to reduce a drive voltage for the semiconductor laser device and improve the reliability of the device. In addition, when the InN contact layer has a thickness between 0.1 $\mu$m and 1 $\mu$m, it is possible to avoid the problem of light absorption loss or metal diffusion, which would occur if the InN contact layer has a thickness of above 1 $\mu$m or below 0.1 $\mu$m. Therefore, according to the present invention, it is possible to provide a very reliable semiconductor laser device.

Further, according to the invention, in the process of fabricating the semiconductor laser device by using the MOCVD process, an organic radical material such as azo tertiary butane is used to form the InN contact layer. Because use of the organic radical material enables a sufficient supply of active nitrogen at a substrate temperature as low as 800° C., a high quality InN contact layer is obtained.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device, comprising:

a semiconductor substrate;

a plurality of $Ga_xAl_yIn_{1-x-y}N (0 \leq x \leq 1, 0 \leq y \leq 1, 0 \leq x+y \leq 1)$ layers sequentially formed on said semiconductor substrate, said $Ga_xAl_yIn_{1-x-y}N$ layers including an InGaN active layer, an AlGaN cladding layer, and an InN contact layer which are formed in this order; and a metal electrode and a dielectric layer formed on said InN contact layer, wherein said InN contact layer having a stripe-shaped surface portion touching a part of said metal electrode and another surface portion touching said dielectric layer.

2. The semiconductor laser device as defined in claim 1, wherein said InN contact layer is electrically separated from a remaining part of said metal electrode by said dielectric layer.

3. The semiconductor laser device as defined in claim 1, wherein said InN contact layer has a thickness ranging from 0.1 $\mu$m to 1 $\mu$m inclusive so as to function to prevent diffusion of said metal electrode.

4. The semiconductor laser device as defined in claim 1, wherein said AlGaN cladding layer is of p-type.

5. The semiconductor laser device as defined in claim 1, wherein said dielectric layer is formed of $SiO_2$.

\* \* \* \* \*